(12) United States Patent
Khare (10) Patent No.: US 8,237,229 B2
(45) Date of Patent: Aug. 7, 2012

(54) METHOD AND APPARATUS FOR BURIED-CHANNEL SEMICONDUCTOR DEVICE

(75) Inventor: Prasanna Khare, Phoenix, AZ (US)

(73) Assignee: STMicroelectronics Inc., Coppell, TX (US)

( * ) Notice: Subject to any disclaimer, the term of this patent is extended or adjusted under 35 U.S.C. 154(b) by 292 days.

(21) Appl. No.: 12/125,852

(22) Filed: May 22, 2008

(65) Prior Publication Data

US 2009/0289279 A1 Nov. 26, 2009

(51) Int. Cl.
*H01L 27/06* (2006.01)
(52) U.S. Cl. .................. 257/370; 257/E29.192
(58) Field of Classification Search .................. 257/370, 257/358, E29.193
See application file for complete search history.

(56) References Cited

U.S. PATENT DOCUMENTS

| | | | | |
|---|---|---|---|---|
| 5,079,518 A | * | 1/1992 | Wakayama | 330/288 |
| 5,104,817 A | * | 4/1992 | Scott | 438/234 |
| 5,302,841 A | * | 4/1994 | Yamazaki | 257/197 |
| 6,228,696 B1 | * | 5/2001 | Nguyen et al. | 438/217 |
| 2003/0162348 A1 | * | 8/2003 | Yeo et al. | 438/218 |
| 2006/0124935 A1 | * | 6/2006 | Bhattacharyya | 257/67 |

OTHER PUBLICATIONS

"Design and optimization of a buried channel PMOS integrable in a Si_{1-x}Ge_{x} BiCMOS process" to Khare et al. available online May 23, 2007. Solid State Electronics 51 (2007) 828-837.*

* cited by examiner

*Primary Examiner* — Thao Le
*Assistant Examiner* — Allen Parker
(74) *Attorney, Agent, or Firm* — Wolf, Greenfield & Sacks, P.C.

(57) ABSTRACT

Methods and apparatus of integrating a buried-channel PMOS into a BiCMOS process. The apparatus comprises at least one bipolar transistor and at least one MOS device coupled to the at least one bipolar transistor, such that a gate of the at least one MOS device may be coupled to an emitter of the at least one bipolar transistor. The MOS device comprises a buried channel having mobility means, such as strained silicon for promoting hole mobility in the buried channel, and confinement means, such as a cap layer disposed proximate to the buried channel for limiting leakage of holes from the buried channel. The apparatus may be formed by exposing a substrate in a PMOS, forming a SiGe layer on the substrate, forming an oxide layer on the SiGe layer, masking the PMOS, and removing at least some of the oxide and at least some of the SiGe layer.

19 Claims, 10 Drawing Sheets

METHOD AND APPARATUS FOR BURIED-CHANNEL SEMICONDUCTOR DEVICE

TECHNICAL FIELD

The present invention relates generally to semiconductor design, and more specifically to a buried-channel PMOS device integrable in a BiCMOS process.

BACKGROUND

BiCMOS processes are used to form integrated circuits with bipolar and complementary metal-oxide semiconductor (CMOS) devices on a single substrate. BiCMOS integrated circuits are used in a variety of applications ranging from microprocessors and memory to communications devices. An advantage of BiCMOS integrated circuits relates to their ability to harness the best attributes of both MOS and bipolar devices. For example, BiCMOS devices may advantageously use characteristics of both MOS devices such as low power consumption and bipolar devices such as high switching speeds and/or regulation of high currents.

CMOS devices use complementary and symmetrical pairs of p-type and n-type metal oxide semiconductor field effect transistors (MOSFETs) for logic functions. When arranged in an integrated circuit, CMOS logic comprises a collection of n-type MOSFETS (NMOSFETs) arranged in a pull-down network between an output node and a low-voltage power supply rail and a collection of p-type MOSFETs (PMOSFETs) arranged to form a pull-up network between the output and a high-voltage rail. By asserting or de-asserting inputs to the CMOS circuit, individual transistors in the pull-down network or the pull-up network become conductive, thereby providing a path from one of the voltage rails to the output. Because CMOS circuits only dissipate power when switching, they dissipate substantially less power than traditional NMOS logic circuits.

To improve the performance of bipolar and CMOS devices, some semiconductor fabrication processes have incorporated the use of strained Si or SiGe layers. The mechanical strain provided by such layers affords device designers the ability to modify the band gap characteristics and carrier mobilities of the devices. The incorporation of strained SiGe layers in bipolar devices has been prevalent, although the use of strained SiGe in CMOS devices has been less common. One reason for this is the fact that buried and surface channel CMOS fabrication is more complex than bulk silicon processing, which adds to the processing costs and reduces the device yield when fabricating such devices. For example, previous SiGe channel PMOSFETs used a selective epitaxial growth (SEG) process, which results in a more complex process than non-selective epitaxial growth.

SUMMARY

At least one embodiment of the present invention is directed to an apparatus comprising at least one bipolar transistor and at least one MOSFET coupled to the at least one bipolar transistor. The MOSFET may comprise a buried channel comprising strained silicon and a cap layer disposed proximate to the buried channel.

At least one embodiment is directed to a method of integrating a buried-channel PMOS into a BiCMOS process. The method comprises exposing a substrate in a PMOS, forming a SiGe layer on the substrate, forming an oxide layer on the SiGe layer, masking the PMOS, and removing at least some of the oxide and at least some of the SiGe layer.

At least one embodiment is directed to an apparatus comprising at least one bipolar transistor and at least one MOS device. The MOS device may comprise a gate coupled to an emitter of the at least one bipolar transistor. The MOS device further comprises mobility means for promoting hole mobility in a buried channel and confinement means for limiting leakage of holes from the buried channel.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The accompanying drawings are not intended to be drawn to scale. In the drawings, each identical or nearly identical component that is illustrated in various figures is represented by a like reference character. For purposes of clarity, not every component may be labeled in every drawing. In the drawings.

DETAILED DESCRIPTION

Embodiments of the present invention relate to a high mobility buried-channel PMOSFET that can be economically integrated into an existing 0.35 μm $Si_{1-x}Ge_x$ BiCMOS process using non-selective SiGe epitaxy. Although conventional buried channel devices may have worse short-channel effects than corresponding surface channel devices, buried channel PMOSFETs disclosed herein may not suffer such short-channel effects due to the total p-layer (i.e., buried channel+cap layer) being very thin (on the order of 14 nm). A comparison of $Si_{1-x}Ge_x$ PMOS with a standard PMOS available in the baseline process shows significant transconductance enhancement resulting in higher switching speeds for the semiconductor device.

Applicants have recognized and appreciated that BiCMOS processes which already use $Si_{1-x}Ge_x$ layers in bipolar devices, may be modified to incorporate compressively strained $Si_{1-x}Ge_x$ layers in the channels of PMOS devices. Since the use of strained SiGe primarily affects hole mobility rather than electron mobility, PMOSFETs may benefit more with strained SiGe than NMOSFETs. Thus, at least one embodiment is directed to the structure and fabrication of a high mobility buried-channel PMOSFET integrated into an existing 0.35 μm $Si_{1-x}Ge_x$ BiCMOS process. According to one embodiment, a buried-channel device with a n+ gate design was selected for various reasons. For example, a 1D-Poisson simulation found that for the same threshold voltage, hole confinement in the $Si_{1-x}Ge_x$ channel is significantly better in the n+ gate design than in the p+ gate design. Additionally, a buried channel device may have reduced surface roughness scattering compared to surface channel devices, and fabrication of a surface channel PMOSFET may have increased process complexity due to additional masking steps needed to introduce n-type doping during $Si_{1-x}Ge_x$ epitaxy. In the present disclosure, various design considerations to increase hole confinement and hole mobility in the buried channel are also considered.

Figure 1:
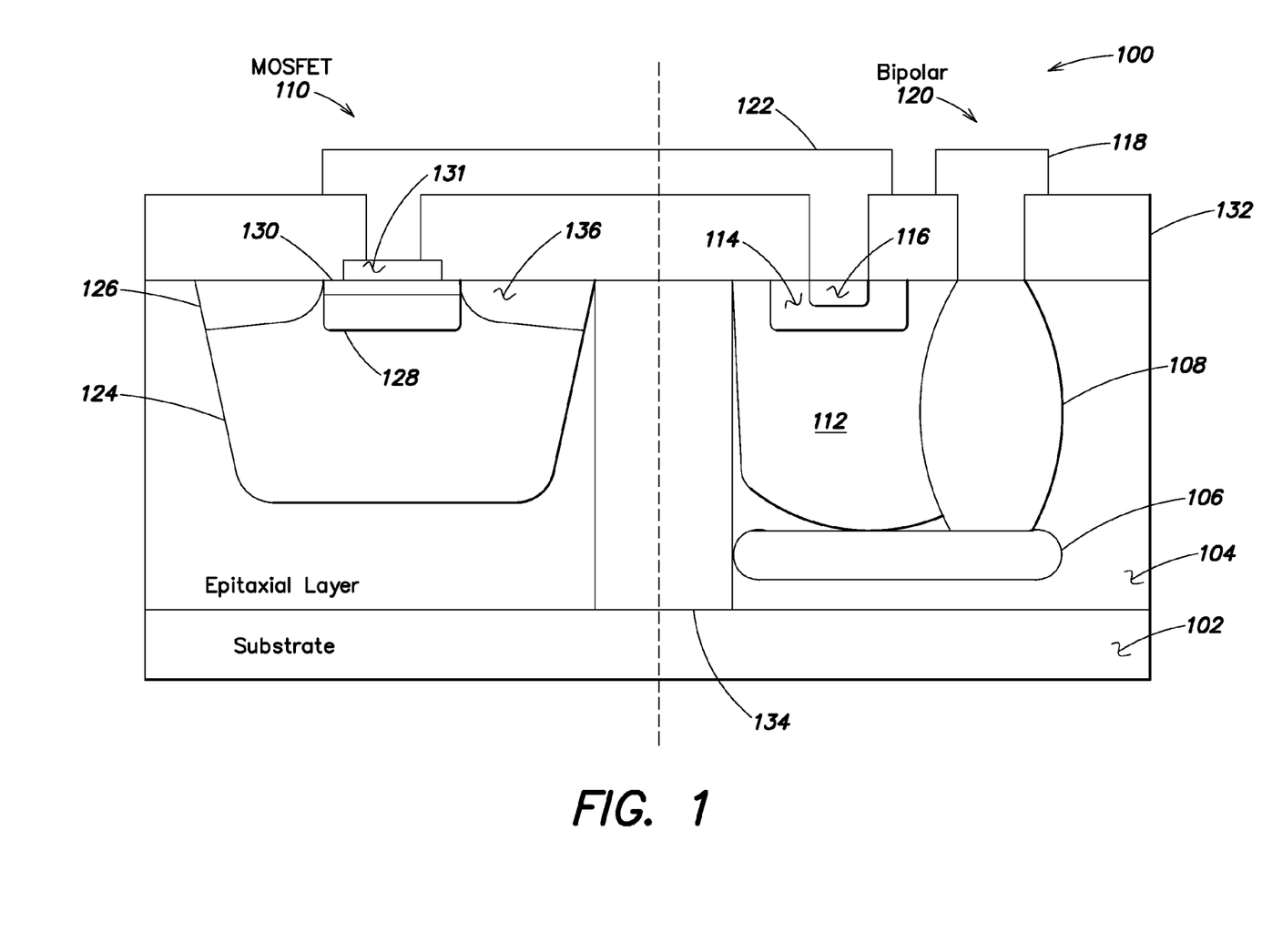
FIG. 1 is a cross-sectional view of a semiconductor device according to at least one embodiment of the invention.

FIG. 1 shows a cross-sectional view of a semiconductor apparatus 100 according to at least one embodiment of the invention. The semiconductor apparatus 100 comprises a substrate layer 102, and an epitaxial layer 104 formed thereon. Formed on the epitaxial layer 104, are two semiconductor devices: a MOSFET 110 and a bipolar transistor 120. Isolation material 134 electrically isolates the MOSFET 110 from the bipolar transistor 120.

The bipolar transistor 120 comprises a buried layer 106, a first well 112, and a collector sinker 108 formed adjacent to the first well 112. The collector sinker 108 couples the buried layer 106 to a collector contact 118. Formed in the first well 112 of the bipolar transistor 120 is emitter material 116 surrounded by base material 114. In at least one embodiment, the bipolar transistor 120 may be an NPN bipolar junction transistor (BJT) in which the buried layer 106, the first well 112, and the emitter 116 are doped with an n-type material and the base 114 is doped with a p-type material. Non-limiting examples of suitable n-type materials include phosphorous, arsenic, or antimony, and non-limiting examples of suitable p-type materials include boron or aluminum. In other embodiments, the bipolar transistor 120 may be a heterojunction bipolar transistor (HBT) or any other suitable type of bipolar transistor, and embodiments of the invention are not limited in this respect.

The MOSFET 110 comprises a second well 124 with source 126 and drain 136 regions formed therein and a gate 131. Interposed between the source 126 and drain 136 is a buried channel 128 and a cap layer 130. The buried channel 128 may be present when the voltage difference between the gate 131 and second well 124 exceeds a threshold value. In at least one embodiment, the MOSFET may be a PMOSFET in which the second well 124 is doped with an n-type material and the source 126 and drain 136 are doped with a p-type material.

When the voltage between the gate 131 and second well 124 exceeds a threshold value, holes flow in the buried channel 128 of PMOSFET 110. A purpose of the cap layer 130 is used to improve the hole confinement in the buried channel 128 when the PMOSFET 110 is conducting. In at least one embodiment, the buried channel 128 and/or the cap layer 130 may comprise silicon, germanium, or some combination thereof. Adding germanium to silicon in the buried channel 128 creates mechanical strain which may increase hole mobility in the channel. However, adding too much germanium to the buried channel 128 may result in a thin buried channel which is not able to contain the inversion charge formed within the channel when the PMOSFET is conducting. In at least one embodiment where the buried channel 128 comprises only silicon, the buried channel may also be strained according to known methods of forming strained silicon. The cap layer 130 may comprise silicon, germanium, or some combination thereof, and may be strained or untrained. In one embodiment of the present invention, the buried channel 128 comprises strained $Si_{1-x}Ge_x$ with a germanium fraction of 30%, and the cap layer comprises strained silicon. It should be appreciated however, that any combination of materials and/or doping may be used and embodiments of the invention are not limited in this respect.

To encapsulate and insulate semiconductor apparatus 100, insulating layer 132 is formed above the MOSFET 110 and bipolar transistor 120. In at least one embodiment, insulating layer 132 may be $SiO_2$, or it may be any other suitable insulating material. Contact 122 is illustrated to indicate that the MOSFET 110 and the bipolar transistor 120 may be electrically coupled in at least one embodiment of the invention, although in other embodiments such electrical coupling between the MOSFET 110 and the bipolar transistor 120 may not be present.

Figure 2:
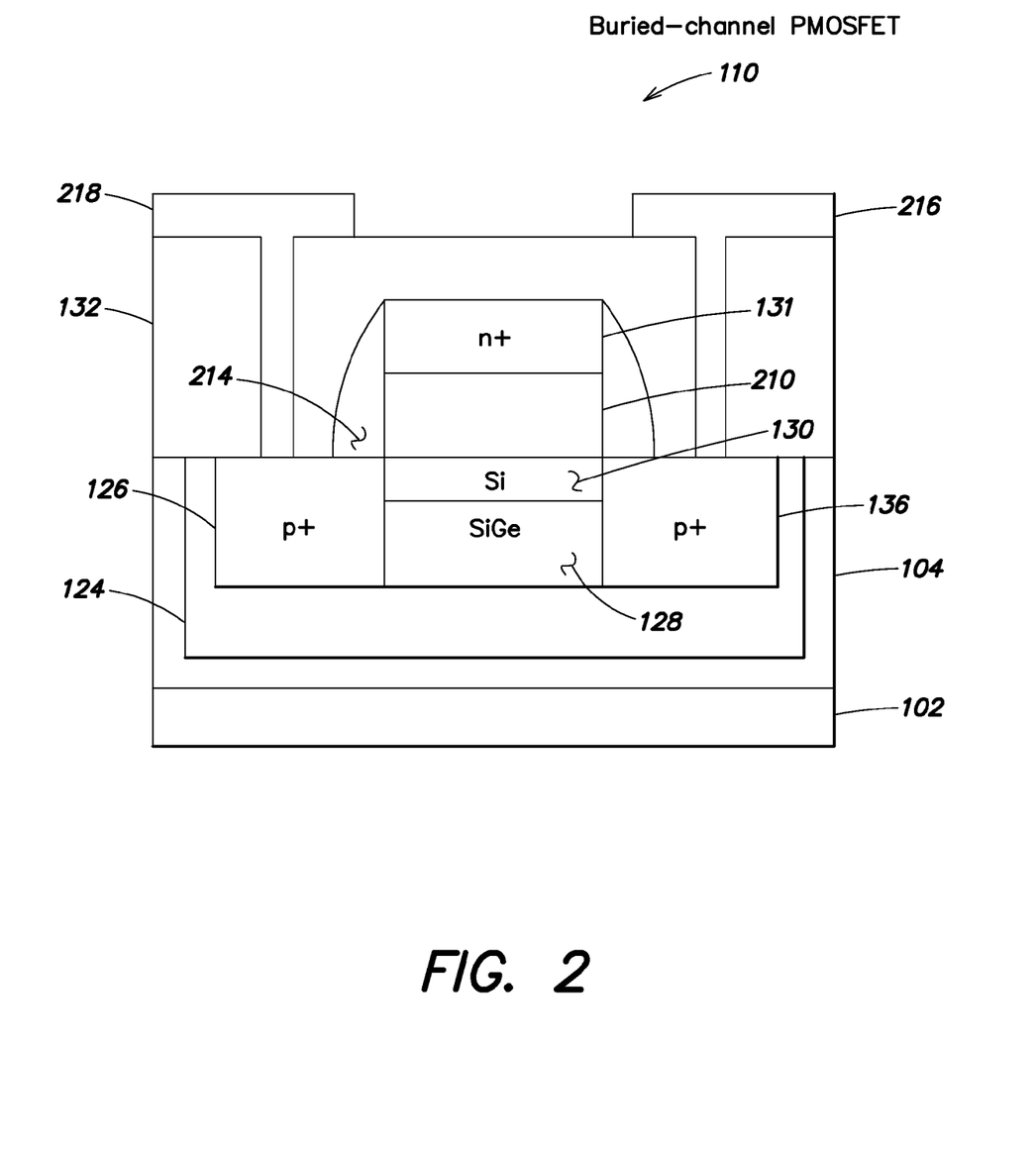
FIG. 2 is a cross-sectional view of a buried-channel PMOSFET according to at least one embodiment of the invention.

According to one embodiment of the invention, FIG. 2 shows a cross-section of MOSFET 110 in which MOSFET 110 comprises a buried-channel PMOSFET. The PMOSFET comprises substrate 102 and epitaxial layer 104 formed thereon. In an embodiment in which the substrate and/or epitaxial layer 104 comprises a p-type material, a well 124 is formed in the substrate/epitaxial layer and the well 124 is doped with an n-type material. Within the well 124, a source region 126 and a drain region 136 are formed. For a PMOSFET, the source region 126 and the drain region 136 may be doped with a p-type material such as boron, which creates an abundance of holes to flow in buried channel 128 situated between the source region 126 and the drain region 136 when the gate-body voltage exceeds a threshold value. The buried channel region 128 may comprise silicon, germanium, or some combination thereof. Disposed proximate to the buried channel region 128 may be cap layer 130. As used in the present disclosure, proximate is defined as being adjacent to, contiguous with, and/or near, and proximate encompasses all conditions whether the material described as proximate is above, below, or to the side of the reference material. According to one embodiment, the cap layer 130 may be a thin layer (e.g., a few nm) of silicon disposed above buried channel 128. In at least one embodiment, the silicon in the cap layer may be strained. Adjacent to the cap layer 130, a gate oxide 210 and a gate 131 may be formed thereon. The gate oxide 210 may serve as a dielectric layer in MOSFET 110. In one embodiment the gate oxide comprises $SiO_2$ and the gate comprises n-doped polysilicon. PMOSFET 110 may further comprise sidewall formations 214, although in at least one embodiment, sidewall formations 214 may not be present. Source contact 218 and drain contact 216 may be formed so as to allow voltages to be applied to the source region 126 and the gate region 136 respectively.

Figure 3:
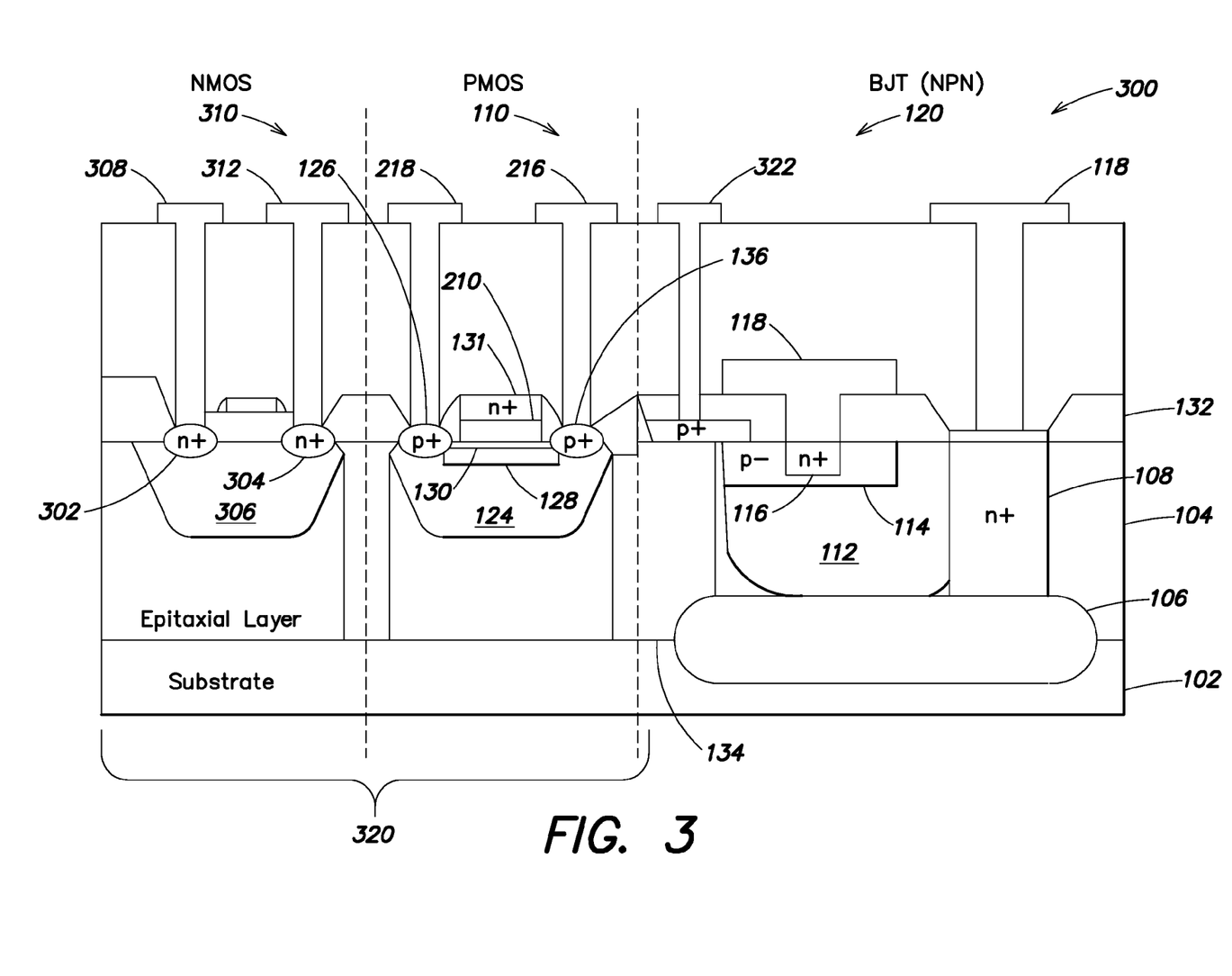
FIG. 3 is a cross-sectional view of a BiCMOS device according to at least one embodiment of the invention.

According to at least one embodiment of the invention, a buried-channel PMOSFET may be incorporated into a BiCMOS device 300 as illustrated in FIG. 3. Together with a complimentary NMOSFET 310, PMOSFET forms a CMOS circuit 320. The NMOSFET 310 comprises a third well 306 that may be doped with a p-type material, and a drain region 302 and a source region 304 formed therein. Each of the drain region 302 and the source region 304 in the NMOSFET may be doped with a n-type material such as phosphorus. The NMOSFET further comprises drain contact 308 and source contact 312 for providing voltages to respective drain 302 and source 304 regions.

While the structure of PMOSFET 110 and bipolar transistor 120 are similar to those shown in FIGS. 1 and 2, it should be appreciated that the structure and/or materials described with reference to FIGS. 1 and 2 may be the same or different with regard to FIG. 3, and embodiments of the invention are not limited in this respect. In at least one embodiment, BiCMOS device 300 may be formed as part of an integrated circuit. Additionally, multiple BiCMOS devices 300 may be electrically coupled on an integrated circuit to form electrical networks which may be used to control, for example, a microprocessor, a memory, a communication device, or any other suitable electronic device.

Figure 4:
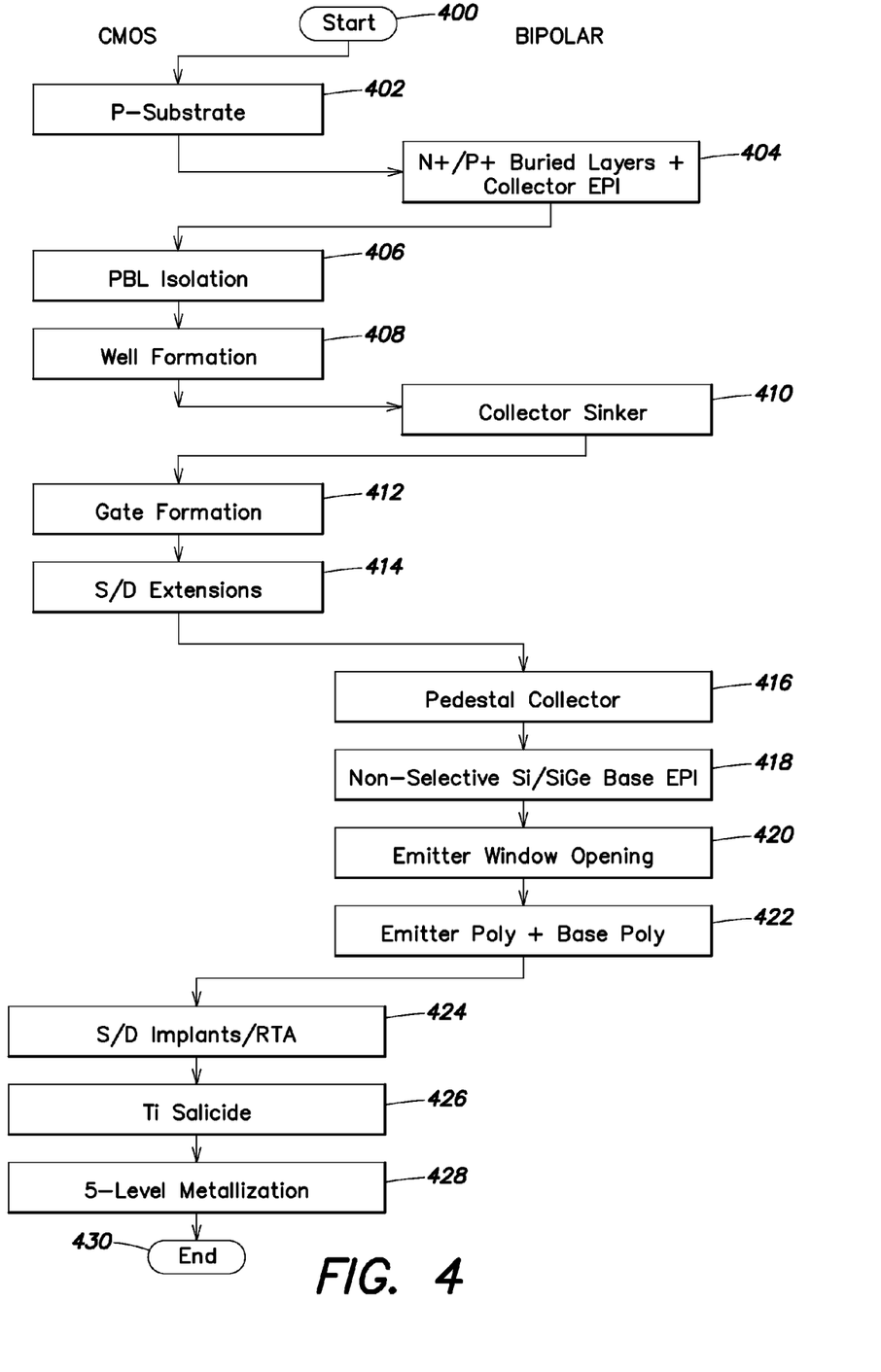
FIG. 4 is a flow diagram of a baseline BiCMOS fabrication process which may be modified according to at least one embodiment of the invention.

According to at least one embodiment of the present invention, fabrication of a buried-channel PMOSFET illustrated in FIGS. 1-3 may be integrated into a baseline BiCMOS process comprising a series of CMOS processing acts and bipolar processing acts as illustrated in FIG. 4. In at least one embodiment, process integration may be done with a base-after-gate scheme, in which the main CMOS process steps are performed before the bipolar steps. By doing so, the base may not be subjected to CMOS thermal steps, such as gate oxidation, sidewall formation, and source/drain oxidation. This may help in maintaining a narrow base profile and ensuring that the SiGe base layer of the bipolar transistor 120 remains strained.

In act 400, the fabrication process may begin, and in act 402 a bulk p-type substrate may be provided. The substrate may be a Si-containing substrate such as Si, SiGe, or a silicon-on-insulator (SOI) material, and may be doped with a p-type material such as boron. In act 404, buried n+ and p+ layers and an epitaxial layer for the collector of the bipolar device may be formed on the substrate. In act 406, isolation structures are formed to electrically isolate neighboring CMOS and bipolar devices on the substrate. The isolation structures may be formed using, for example, a poly-buffered LOCOS (PBL) process, as is commonly known in the art. After isolation, the epitaxial layer may be masked and wells may be formed in the substrate in act 408. In act 410, a collector sinker may be formed so as to extend the region of the buried n+ region up to the surface. In act 412, the gates of the CMOS devices may be formed using an oxidation process followed by polysilicon deposition/doping, or the gates may be formed using any other suitable procedure. Following gate formation, source/drain extensions and source/drain regions may be formed in act 414. In act 416, a pedestal collector may be formed contiguous with the collector sinker formed in act 410. In act 418, non-selective Si/SiGe base epitaxy may be used to form the intrinsic base layer of an NPN bipolar device and a poly-Si base electrode. In one embodiment, the epitaxy may be carried out at 650° C. using H2/SiH4/GeH4/B2H6 chemistry, so that the NPN base is heavily boron-doped $Si_{1-x}Ge_x$. In act 420, a window opening for the emitter of the NPN bipolar device may be opened, and in act 422, the emitter and base of the NPN may be formed. Following completion of the bipolar acts, the remaining CMOS acts may be performed. In act 424, the source/drain implants may be made by injecting doping agents into the source/drain extension regions, followed by a rapid thermal anneal (RTA) to enhance doping diffusion. In act 426, a titanium salicide may be formed in the active regions of the device to form electrical contacts. In act 428, a metallization process completes the fabrication process, and the fabrication process ends in act 430. Metallization may be performed in any suitable way, such as by filament evaporation, flash evaporation, electron-beam evaporation, or sputtering, and embodiments of the invention are not limited in this respect. The aforementioned process may result in a structure similar to that illustrated in FIG. 3 having complementary NMOS and PMOS devices (collectively CMOS) and an NPN bipolar transistor. It should be appreciated that other types of bipolar devices may be substituted for the NPN bipolar transistor, such as a heterojunction bipolar transistor (HBT), and embodiments of the invention are not limited in this respect.

Since the $Si_{1-x}Ge_x$ layer may be p-type doped and the emitter may be n+-polysilicon, a PMOSFET may be formed by using the emitter as the gate and $Si_{1-x}Ge_x$ layer as the channel. To make a buried channel device, the dielectric can be obtained by not opening an emitter-cut in act 420 prior to emitter poly-Si deposition in act 422. For an enhancement-mode buried channel device, the top p-layer should be completely depleted of holes at zero gate bias, although this may not be possible using the process described above as the boron concentration may be too high, resulting in the device being "on" at zero bias. To remedy this, in at least one embodiment, a separate epitaxy for the $Si_{1-x}Ge_x$ PMOS may be used, in which the boron layer thickness and doping concentration may be kept reasonably low.

Figure 5:
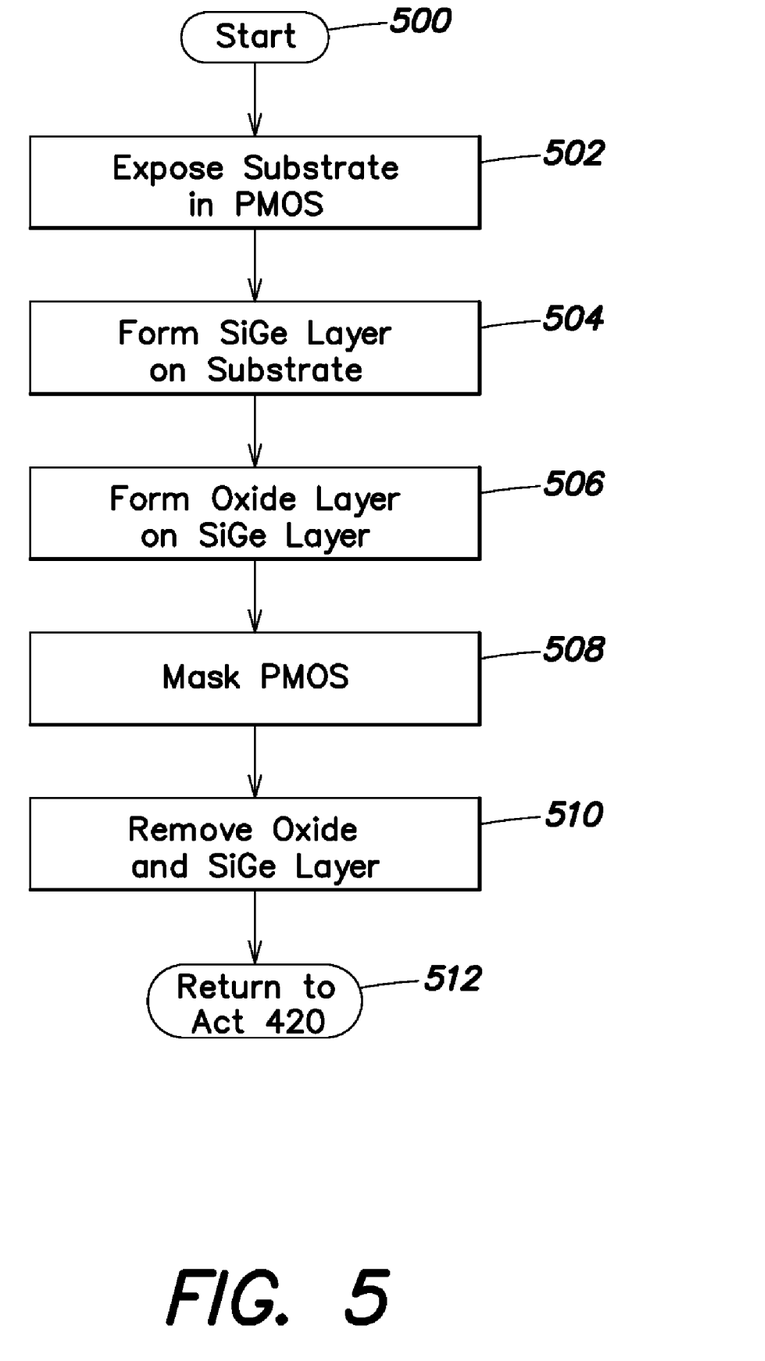
FIG. 5 is a flow diagram of a fabrication process for a buried-channel PMOSFET according to at least one embodiment of the invention.

According to at least one embodiment, a series of $Si_{1-x}Ge_x$ PMOS specific acts may be inserted between acts 418 and 420 to fabricate a buried-channel strained SiGe PMOSFET device. A process illustrating this PMOS specific series of acts is shown in FIG. 5. Act 500 may correspond to the completion of non-selective Si/SiGe base epitaxy (i.e., act 418 in FIG. 4). In act 502, an opening in the PMOS device may be formed to expose the substrate. In act 504, a thin $Si_{1-x}Ge_x$ layer (e.g., a few nm) may be formed on the substrate providing the buried $Si_{1-x}Ge_x$ channel and the cap layer. Then in act 506, an oxide may be formed on the $Si_{1-x}Ge_x$ layer. In one embodiment, the thickness of the oxide layer may be approximately 70 Å and in at least one embodiment, the oxide layer may be formed by depositing PECVD oxide rather than by using a conventional thermal growth process. Depositing PECVD oxide may allow both the older $Si_{1-x}Ge_x$ layer formed in act 418 and the newer $Si_{1-x}Ge_x$ layer formed in act 504 to remain strained. In act 508, a mask may be applied to the $Si_{1-x}Ge_x$ layer of the PMOS and at least some of the PECVD oxide formed in act 506 and the $Si_{1-x}Ge_x$ layer formed in act 504 may be removed in act 510. In act 512, the BiCMOS process illustrated in FIG. 4 may be resumed at act 420.

Figure 6:
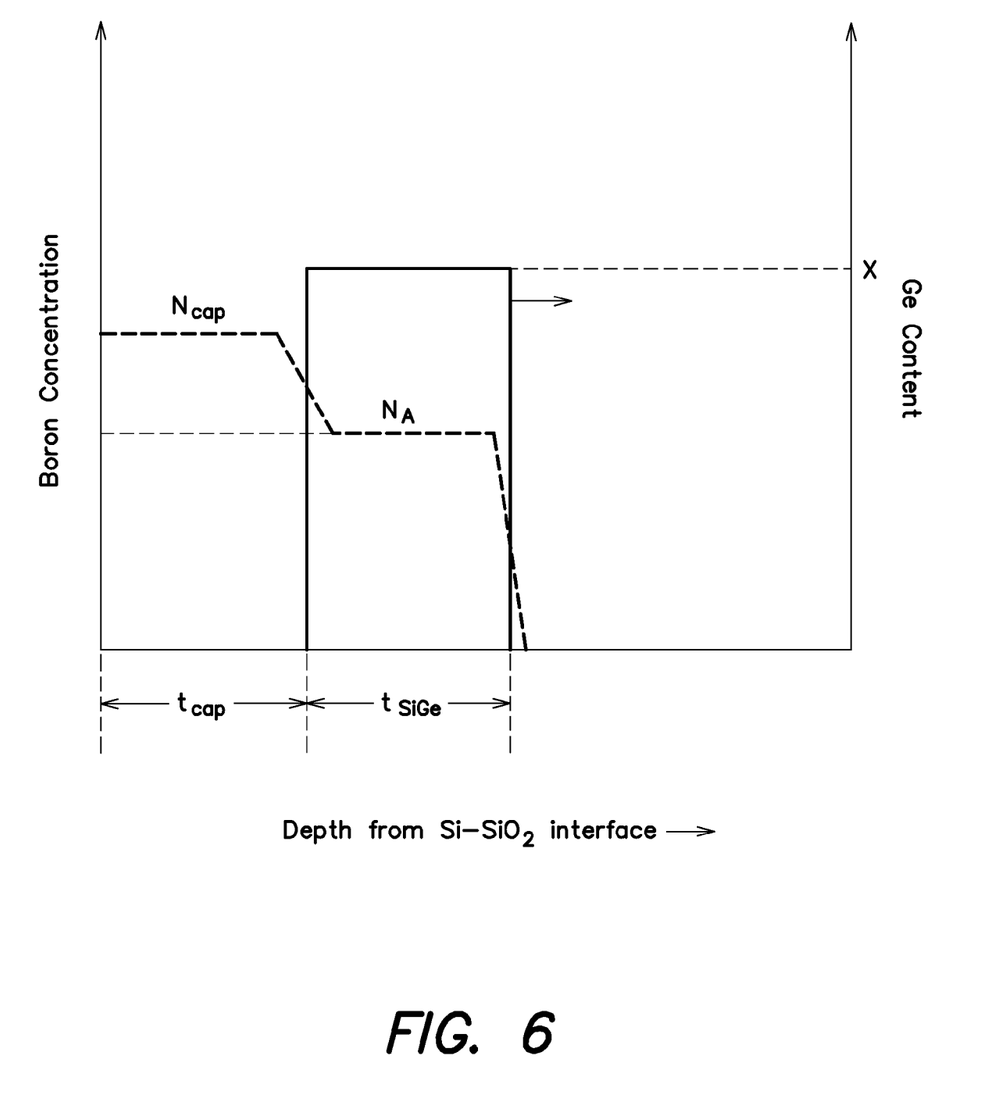
FIG. 6 is a diagram of configurable design parameters for the buried-channel PMOSFET according to at least one embodiment of the invention.

According to an embodiment of the invention, computer simulations may be used to manipulate various design parameters illustrated in FIG. 6 to determine their relationship on hole confinement and hole mobility in the buried channel PMOSFET device described above. For example, the germanium (Ge) profile including the Ge fraction in the $Si_{1-x}Ge_x$ layer (x) and the $Si_{1-x}Ge_x$ layer thickness ($t_{SiGe}$) were manipulated. The impact of changing the cap layer thickness ($t_{cap}$), the amount of p-type doping in the cap layer ($N_{cap}$), the amount of doping in the $Si_{1-x}Ge_x$ layer ($N_A$) was also investigated. In the simulations, device constraints including strain relaxation and oxide interface quality were also taken into account.

Only rectangular profiles as shown in FIG. 6 were considered in the simulations, as rectangular profiles allow for modeling of the drain current and rectangular profiles may be easier to implement in the process. Since the growth rate is typically very high during $Si_{1-x}Ge_x$ epitaxy, and the growth time is very short, profiles other than rectangular increase the process complexity significantly.

Figure 7:
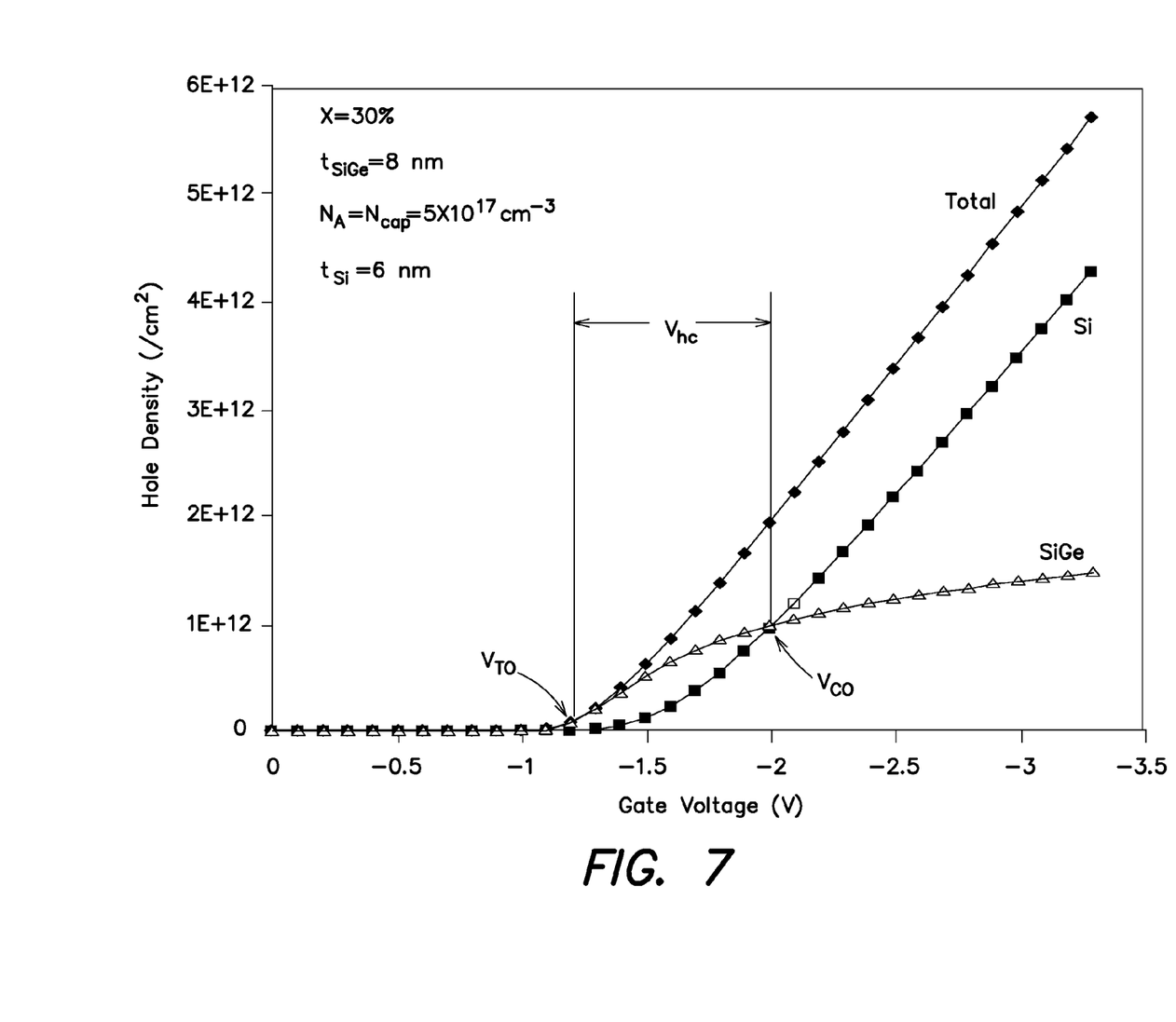
FIG. 7 is a diagram of hole density versus gate voltage for at least one embodiment of the invention.

Using the simulations, diagrams of the integrated hole densities in the Si cap ($Q_{Si}$) and in the $Si_{1-x}Ge_x$ layer ($Q_{SiGe}$) plotted against gate voltage were obtained as shown in FIG. 7. It should be appreciated that the diagram shown in FIG. 7 is a illustrative example of one combination of the aforementioned parameters (x=30%, $t_{SiGe}$=8 nm, $N_A$=$N_{cap}$=$5\times10^{17}$ cm$^{-3}$, and $t_{Si}$=6 nm), and other diagrams may be made by changing any one of the configurable parameters in the model. As observed from the diagram illustrated in FIG. 7, $V_{CO}$ (cross-over voltage) is the gate voltage where $Q_{Si}$ exceeds $Q_{SiGe}$, and $V_{TO}$ is equivalent to the threshold voltage and is the intercept of linear extrapolation of total hole density ($Q_{total}$) on gate voltage axis. $V_{hc}$ which is the difference between $V_{CO}$ and $V_{TO}$ is the gate voltage range of the linear region of the MOSFET over which holes flow predominantly in the high-mobility $Si_{1-x}Ge_x$ channel.

Thus, in one embodiment, to increase hole confinement in the $Si_{1-x}Ge_x$ layer, $V_{hc}$ may be increased. However, it is not enough to increase only the cross-over voltage ($V_{CO}$), because the threshold voltages ($V_{TO}$) may be different for different designs, and $V_{TO}$ can be adjusted by altering $N_A$. $V_{hc}$ is a measure of how long the $Si_{1-x}Ge_x$ buried-channel PMOSFET works better than a Si PMOSFET once the device is turned on. In an ideal case, $V_{hc}$ would equal the maximum drain voltage ($V_{dd}$) so that more holes would always be present in the SiGe channel than in the parasitic Si channel (i.e., the cap layer). In at least one embodiment, hole mobility was further analyzed beyond simply increasing $V_{hc}$, because even if two structures have the same $V_{hc}$, they may still have different hole mobilities if the Ge content differs.

Using the above-described simulations, the impact of each design parameter illustrated in FIG. 6 was evaluated. Ge content in the $Si_{1-x}Ge_x$ layer increases the hole mobility and improves the hole confinement through a deeper well in the valence band. However, to avoid strain relaxation, the thickness of the $Si_{1-x}Ge_x$ layer should not exceed the critical layer thickness which reduces with Ge fraction. Three different combinations of Ge fraction and $Si_{1-x}Ge_x$ layer thickness satisfying the Matthew-Blakeslee criterion were simulated as shown in Table 1.

TABLE 1

Effect of Ge content on hole confinement

| Ge fraction (%) | SiGe thickness (nm) | $V_{co}$ (V) | $V_{TO}$ (V) | $V_{hc}$ (V) |
| --- | --- | --- | --- | --- |
| 15 | 20 | −1.88 | −1.12 | 0.76 |
| 20 | 15 | −2.02 | −1.21 | 0.81 |
| 30 | 8 | −2.02 | −1.35 | 0.67 |

Although strained layers with thicknesses greater than the Matthew-Blakeslee criterion can be grown, they were not considered because the thermal budget at rapid thermal anneal (RTA) is very severe (several seconds at >1000° C.), and MOSFETs made with 10 nm thick layers of 40% Ge (which does not satisfy Matthew-Blakeslee criterion), have shown a severe performance degradation. In each of the cases illustrated in Table 1, the parameters $t_{Si}$=6 nm, and $N_A$=$N_{cap}$=$5\times10^{17}$ cm$^3$ were held constant.

As can be observed from Table 1, the variation in $V_{hc}$ is modest. As the Ge content increases, the well in the valence band becomes deeper and is able to confine holes better. Thus, $V_{hc}$ increases when the Ge fraction is increased from 15% to 20%. For a Ge fraction of 30%, the $Si_{1-x}Ge_x$ layer is so thin (8 nm) that it is not able to hold as much of the inversion charge. In other words, even though the well in the valence band is deeper, it is not wide enough, and some charge spills into the cap layer, and $V_{hc}$ drops. The $Si_{1-x}Ge_x$ layer thickness should be wide enough to contain most of the inversion charge and low enough to allow a high Ge fraction. Thus, according to one embodiment of the present invention, the $Si_{1-x}Ge_x$ layer may be 15 nm thick and have a Ge fraction of 20%, because under these conditions $V_{hc}$ is slightly higher than for other designs. In another embodiment, the $Si_{1-x}Ge_x$ layer may have a Ge fraction of 30% and a thickness of 8 nm, because 2-D simulations show that mobility enhancement for designs with a Ge fraction of 30% may be larger than designs with a Ge fraction of 20%, so that the higher mobility in the 30% Ge fraction overcomes the inversion charge loss to the cap layer evident as a lower $V_{hc}$.

A thinner cap layer may result in better hole confinement and a wider operating region with transconductance remaining at its peak. A thinner cap layer may also increase the gate-to-channel capacitance. On the other hand, a thicker cap layer may result in a higher off-state leakage current because of reduced gate control in the subthreshold regime. For at least these reasons, it appears that the thinnest possible cap layer should be used.

Figure 8:
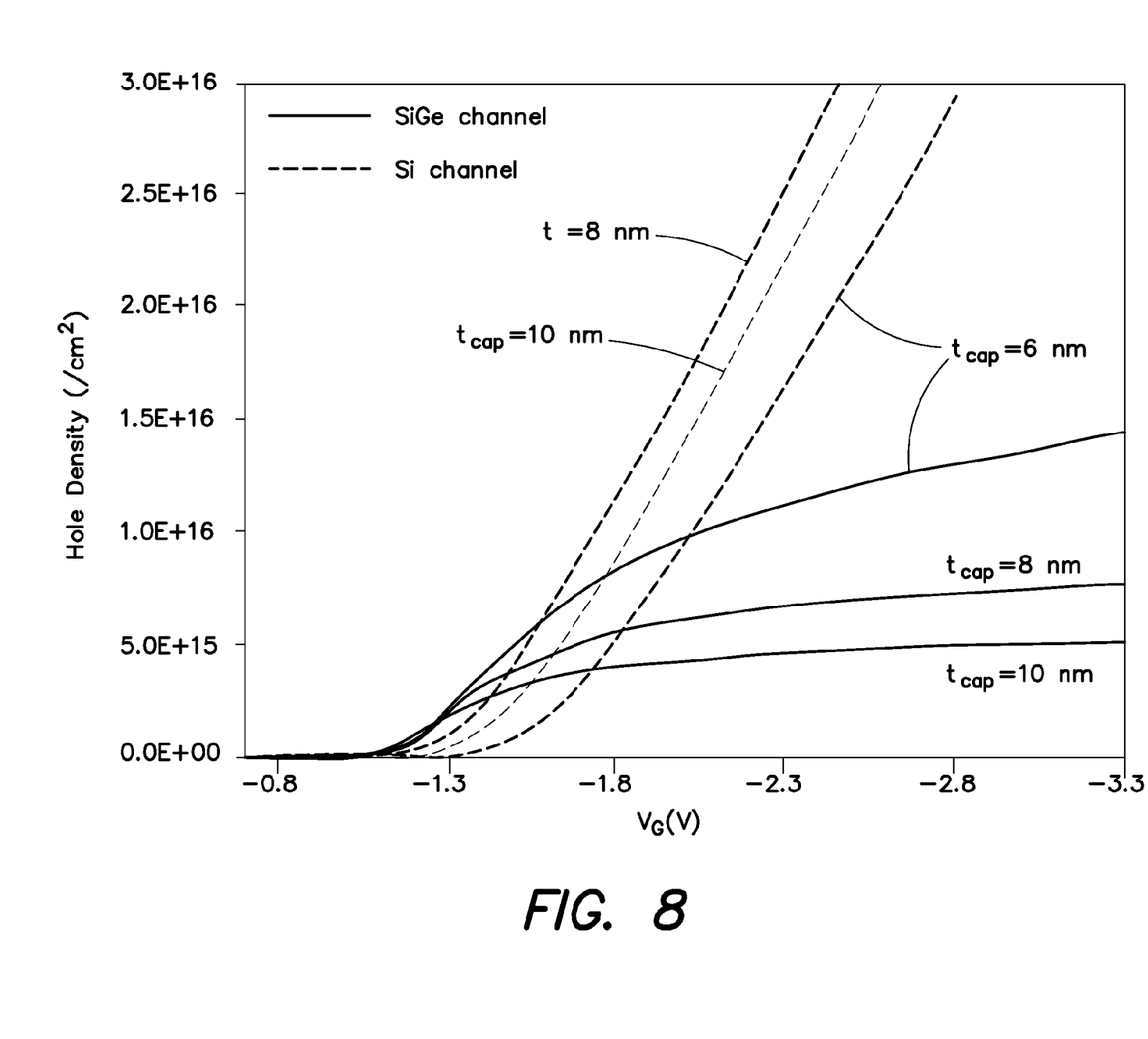
FIG. 8 is a diagram comparing different cap thicknesses of at least one embodiment of the invention.

Hole confinement for five different cap layer thicknesses (2, 4, 6, 8 and 10 nm) was simulated, and it was found that the $V_{CO}$ and $V_{hc}$ reduced as the cap thickness was increased as shown in FIG. 8. In FIG. 8, curves for the 2 nm and 4 nm are not shown because for the 2 nm thick cap, the Ge tail was found to have reached the oxide interface, leaving no Si cap, and for the 4 nm thick cap, the Si—$Si_{1-x}Ge_x$ interface was found to be extremely close to the Si—$SiO_2$ interface, so that numerically it was not possible to integrate the hole density in the Si cap.

Interface roughness scattering is less in devices with thicker cap layers, not only because of increased distance from the interface, but also because the lower amplitude of the Ge segregation tail at the Si—$SiO_2$ boundary leads to a smoother interface. Thus, there is a trade-off with the cap layer thickness. As observed in FIG. 8, a cap thickness down to 6-8 nm is a good compromise between hole confinement and mobility. Thus according to one embodiment of the invention, the cap layer may have a thickness of 6 nm.

The effect of cap layer doping concentration on hole confinement was also examined with simulations. Six different values of cap layer doping density ($N_A$) were modeled. $V_{CO}$ did not show a strong dependence on $N_A$, as shown in Table 2.

TABLE 2

Effect of cap layer doping density on hole confinement

| Cap doping (cm$^3$) | $V_{co}$ (V) | $V_{TO}$ (V) | $V_{hc}$ (V) |
| --- | --- | --- | --- |
| 0 | −2.17 | −1.47 | 0.70 |
| 5.00E+16 | −2.17 | −1.46 | 0.71 |
| 1.00E+17 | −2.16 | −1.45 | 0.72 |
| 5.00E+17 | −2.15 | −1.36 | 0.78 |
| 7.50E+17 | −2.16 | −1.32 | 0.84 |
| 1.00E+18 | −2.17 | −1.27 | 0.91 |

However, as the doping density in the cap layer increases, the threshold voltage ($V_{TO}$) reduces, and hence $V_{hc}$ increases. Threshold voltage can be adjusted by reducing the doping density in the $Si_{1-x}Ge_x$ layer, as the threshold voltage depends upon the total charge in the p-layer (i.e., channel+cap layer). In one embodiment, the $Si_{1-x}Ge_x$ layer may be kept completely undoped and the cap layer doped. In this embodiment, the doping density in the cap layer may then be used to adjust the threshold voltage. For example, a MODMOSFET with the delta-doped layer above the $Si_{1-x}Ge_x$ channel may be used. In other embodiments, the boron doping concentration in the cap layer and the $Si_{1-x}Ge_x$ layer may be the same, thereby requiring no abrupt switching of diborane flow during fabrication.

Figure 9:
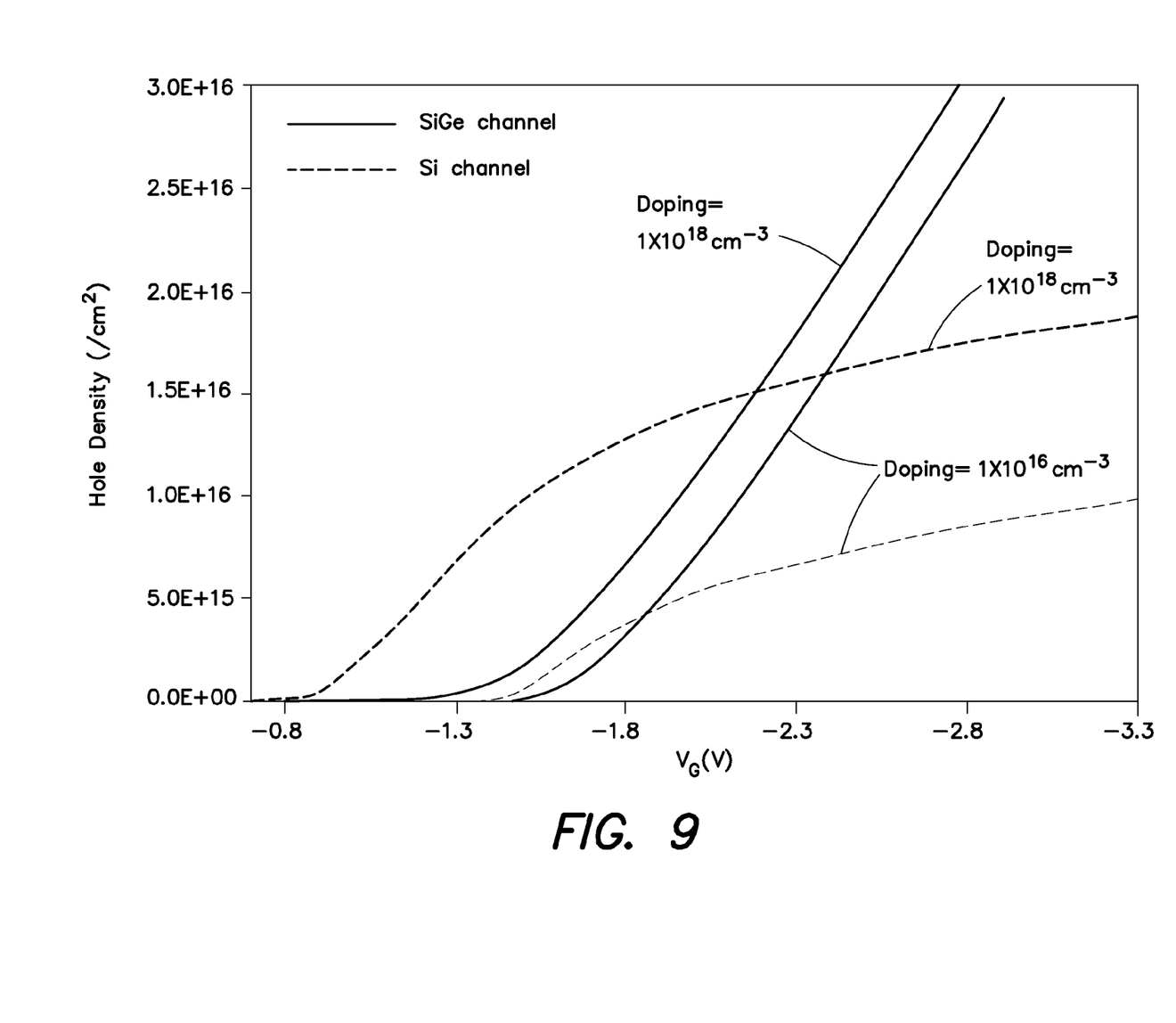
FIG. 9 is a diagram showing the effect of doping density on hole confinement according to at least one embodiment of the invention.

Hole confinement for four different boron concentrations in the $Si_{1-x}Ge_x$ and Si cap layers were simulated. FIG. 9 shows the hole densities in the Si cap and $Si_{1-x}Ge_x$ channel layers for two doping densities ($1\times10^{16}$ cm$^{-3}$ and $1\times10^{18}$ cm$^{-3}$). As observed in FIG. 9, $V_{CO}$ and $V_{TO}$ both change slightly as doping density is varied. For a 0.35 μm CMOS technology, the threshold voltage of the PMOS is around −600 mV. Thus, in one embodiment, the doping concentration in the $Si_{1-x}Ge_x$ layer may be $1.4\times10^{18}$ cm$^{-3}$ so that the threshold voltage $V_{TO}$ is approximately −620 mV.

Thus, according to the simulations described above, an embodiment of the present invention may have the following design parameters for the SiGe PMOSFET: x=0.3, $t_{SiGe}$=8 nm, $t_{cap}$=6 nm, $N_{cap}=N_A=1.4\times10^{18}$ cm$^{-3}$. The drain current and transconductance of an embodiment of the present invention having these design parameters was compared to a conventional surface channel PMOSFET having a p-type polysilicon gate available in the baseline process (i.e., as illustrated in FIG. 4) using 2-D simulations. The simulated threshold voltage for the 0.35 μm conventional PMOSFET was −477 mV.

Figure 10:
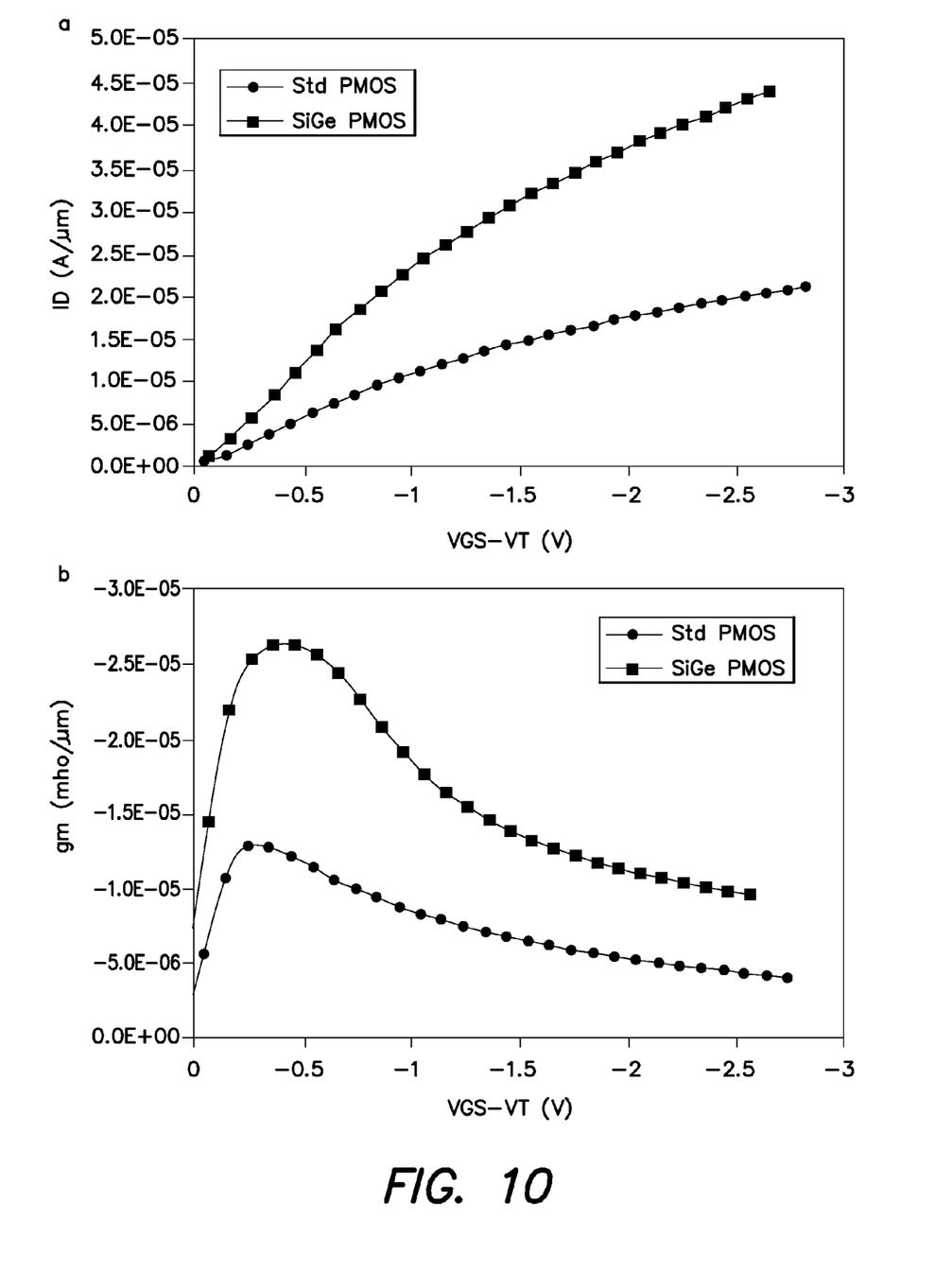
FIGS. 10a and 10b illustrate respectively, the drain current and transconductance for at least one embodiment of the invention and a standard PMOS device.

Since the threshold voltages for the two designs are different, the drain current and transconductance is plotted against ($V_{GS}$-$V_{TO}$) where $V_{GS}$ is the gate-source voltage as illustrated in FIGS. 10a and 10b respectively. As shown in FIGS. 10a and 10b, the $Si_{1-x}Ge_x$ PMOS disclosed herein has a >2× higher drain current and a two-fold increase in linear region transconductance and hence higher speed than the standard PMOS device.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding,"

"composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An apparatus, comprising:
    at least one bipolar transistor;
    at least one MOSFET coupled to the at least one bipolar transistor, the at least one MOSFET comprising:
    source/drain regions doped with a dopant of a first type;
    a buried channel comprising strained silicon, wherein the buried channel is interposed between the source/drain regions and is doped with a dopant of the first type;
    a cap layer disposed proximate to the buried channel; and
    a gate disposed proximate to the cap layer, wherein the gate is doped with a dopant of a second type different from the first type.

2. The apparatus of claim 1, wherein the cap layer is disposed above the buried channel.

3. The apparatus of claim 1, wherein the gate of the at least one MOSFET is contiguous with an emitter of the at least one bipolar transistor.

4. The apparatus of claim 1, wherein the gate of the at least one MOSFET comprises polysilicon, the polysilicon being doped with an n-type material.

5. The apparatus of claim 4, wherein the buried channel comprises approximately 30% germanium.

6. The apparatus of claim 1, wherein the buried channel further comprises germanium.

7. The apparatus of claim 1, wherein the cap layer comprises silicon.

8. The apparatus of claim 1, wherein the buried channel and the cap layer are doped with a p-type material.

9. The apparatus of claim 8, wherein the p-type material is boron.

10. The apparatus of claim 8, wherein the buried channel and the cap layer are doped with the same percentage of p-type material.

11. The apparatus of claim 1, wherein the at least one bipolar transistor is a heterojunction bipolar transistor (HBT).

12. An apparatus, comprising:
    at least one bipolar transistor;
    at least one PMOSFET coupled to the at least one bipolar transistor; the PMOSFET comprising:
    a buried channel comprising strained silicon, wherein the buried channel is doped with an p-type dopant;
    a cap layer disposed proximate to the buried channel; and
    a gate disposed proximate to the cap layer, wherein the gate is doped with an n-type dopant.

13. The apparatus of claim 12, wherein the cap layer is disposed above the buried channel.

14. The apparatus of claim 12, wherein the gate of the at least one PMOSFET is contiguous with an emitter of the at least one bipolar transistor.

15. The apparatus of claim 12, wherein the gate of the at least one PMOSFET comprises polysilicon doped with the n-type dopant.

16. The apparatus of claim 12, wherein the buried channel further comprises germanium.

17. The apparatus of claim 12, wherein the cap layer comprises strained silicon.

18. The apparatus of claim 12, wherein the p-type dopant is boron.

19. The apparatus of claim 12, wherein the at least one bipolar transistor is a heterojunction bipolar transistor (HBT).

* * * * *

UNITED STATES PATENT AND TRADEMARK OFFICE
CERTIFICATE OF CORRECTION

| | |
|---|---|
| PATENT NO. | : 8,237,229 B2 |
| APPLICATION NO. | : 12/125852 |
| DATED | : August 7, 2012 |
| INVENTOR(S) | : Prasanna Khare |

It is certified that error appears in the above-identified patent and that said Letters Patent is hereby corrected as shown below:

Col. 4, line 13, should read:
unstrained. In one embodiment of the present invention, the Signed and Sealed this
Twenty-fifth Day of September, 2012

David J. Kappos
*Director of the United States Patent and Trademark Office*